United States Patent [19]

Matsuno et al.

[11] Patent Number: 5,466,494
[45] Date of Patent: Nov. 14, 1995

[54] METHOD FOR PRODUCING THIN FILM

[75] Inventors: Akira Matsuno; Takashi Nire, both of Hiratsuka, Japan

[73] Assignee: Kabushiki Kaisha Komatsu Seisakusho, Tokyo, Japan

[21] Appl. No.: 10,765

[22] Filed: Jan. 29, 1993

[51] Int. Cl.$^6$ .................................................... C23C 16/00
[52] U.S. Cl. ............................ 427/561; 427/58; 427/64; 427/126.1; 427/255.2; 427/255.7; 427/294; 427/419.7; 427/585; 427/595; 428/690; 428/698; 428/704
[58] Field of Search ..................................... 427/585, 595, 427/419.7, 58, 64, 126.1, 294, 255.2, 561, 255.7; 428/690, 698, 704

[56] References Cited

FOREIGN PATENT DOCUMENTS

| 61-213370 | 9/1986 | Japan . |
| 62-160694 | 7/1987 | Japan . |
| 4-214856 | 8/1992 | Japan . |
| 4-214857 | 8/1992 | Japan . |

*Primary Examiner*—Bernard Pianalto
*Attorney, Agent, or Firm*—Richards, Medlock & Andrews

[57] ABSTRACT

A thin sulfide film can be formed by simultaneously generating under different conditions a plurality of deposition materials to be deposited on a substrate, using the fact that sulfur has a higher vapor pressure. Sulfur vapors can be generated in an external vessel (6) which is located outside the vacuum deposition vessel (1). The sulfur vapors can then be introduced into the vacuum deposition vessel (1) through a vapor inlet tube (7) to form a localized atmosphere of sulfur vapors within the vacuum deposition vessel (1) in the vicinity of the substrate which is positioned on a substrate holder (4). Chemical bonding, on the substrate, of the sulfur vapors and the vapors of other deposition materials generated from other deposition sources provided in the vacuum deposition vessel (1) form a thin film of high quality with good reproducibility. The vapor inlet tube (7) can project inwardly within the vacuum deposition vessel (1) with its outlet being positioned closely adjacent to the substrate so as to concentrate the sulfur vapors at the substrate. The vapor inlet tube (7) can be provided with a heater 11 to maintain the vapor state of the material passing therethrough.

16 Claims, 4 Drawing Sheets

METHOD FOR PRODUCING THIN FILM

FIELD OF THE INVENTION

The present invention relates to a method and apparatus for producing a thin film by deposition of vaporous materials on a substrate, and to the resulting thin film. In a specific aspect, the invention relates to a method and apparatus for producing a thin sulfide film, in which a film is formed by simultaneously depositing sulfur and other deposition materials on a substrate.

BACKGROUND OF THE INVENTION

Known methods of producing a thin sulfide film using a vacuum film-forming apparatus include a multi-source deposition method (referred to as "MSD method" hereinafter), a chemical vapor deposition method (referred to as "CVD method" hereinafter), an electron beam deposition method, and a sputtering method. Known film-forming apparatuses include a multi-source deposition apparatus (referred to as "MSD apparatus" hereinafter), a chemical vapor deposition apparatus (referred to as "CVD apparatus" hereinafter), an electron beam deposition apparatus, a sputtering apparatus, and the like.

A thin sulfide film can be readily formed wherein the amount of sulfur in the film is a value smaller than that of the stoichiometric composition. In the CVD method or the sputtering method, a film is formed by introducing a gaseous sulfur compound, e.g., hydrogen sulfide gas or the like, into a vacuum deposition vessel from the outside thereof such that the sulfur loss is decreased. A sputtering method using sulfur as a sputtering gas has also been proposed (refer to Japanese Patent Laid-Open No. 61-213370).

In the electron beam deposition method, although a sintered sulfide is sometimes evaporated without any treatment, co-deposition (referred to as "electron beam co-deposition method" hereinafter) is generally effected in which a crucible, separate from the electron beam deposition source, is provided within the vacuum deposition vessel as the sulfur source in order to prevent a sulfur loss. This separate crucible is at least partially filled with sulfur, and is heated during the electron beam deposition operation to thereby supply excessive sulfur to the substrate to be coated. A reactive deposition method, in which a sulfur compound such as hydrogen sulfide or the like is introduced into a vacuum deposition vessel, can also be employed for the same purpose.

In the MSD method, a plurality of deposition sources, which are contained in a vacuum deposition vessel, are at least partially filled with the respective deposition materials, and the deposition materials are evaporated by separately heating the deposition sources, to form a film on a substrate by the chemical bonding of the vapors of these deposition materials. The thin sulfide film formed by the MSD method has better crystallinity than that of the films formed by other methods. When the thin sulfide film is used in a thin film electroluminescence element, the element can be driven at a low voltage and has a significantly high luminance (refer to Japanese Patent Laid-Open No. 62-160694).

However, the thin sulfide film producing method, such as the CVD method or the sputtering method, in which a gaseous sulfur compound is introduced into a vacuum deposition vessel has a problem with respect to interference with the film functions, where the interference is caused by the non-sulfur component of the gaseous sulfur compound. Since the sulfur compound introduced and the decomposition products thereof frequently have high toxicity, a recovery apparatus is generally required, thereby complicating the whole production apparatus.

The sputtering method which uses sulfur as the sputtering gas has the following problems: the ions of the thin film formed are damaged, and thus a good film cannot be obtained. Since a sputtering target must be cooled in order to prevent damage to the target, the sulfur can easily adhere to the target, and the reproducibility deteriorates due to a change in the composition of the target. In addition, when sulfur vapors are simply introduced into the vacuum deposition vessel, the efficiency of use of the sulfur deteriorates due to the diffusion of the sulfur vapors over the entire volume of the vacuum deposition vessel. Since the sulfur nozzle is formed in the wall surface of the vacuum deposition vessel, the sulfur nozzle cannot be easily heated, and as a result some of the sulfur adheres to the nozzle, thereby deteriorating the controllability. Since the nozzle is at a relatively low temperature, sulfur can form an eight-member ring which has low reactivity, and the efficiency of use of the sulfur thus deteriorates.

When elemental sulfur or a simple sulfur substance is evaporated from a source thereof within the vacuum deposition vessel, as in the conventional electron beam deposition method or the conventional MSD method, the amount of sulfur evaporated can readily vary with any variations in the heat radiated from the other deposition sources, since there are large differences between the vapor pressure of sulfur and the vapor pressures of the other commonly employed deposition materials.

For example, when a thin film serving as a light emitting layer of a thin film electroluminescence element and composed of ZnS:Mn, CaS:Eu, SrS:Ce, or the like, is formed by the evaporation of sulfur within the vacuum deposition vessel, the sulfur must be evaporated in an amount substantially greater than that of the other deposition materials, since sulfur has a lower probability of adhesion to a substrate than many other deposition materials such as Zn, Mn, Ca, Eu, Sr, Ce, and the like. As a result, the level of the molten sulfur in the crucible changes significantly, and the amount of the sulfur evaporated thus changes. Since it is thus necessary to frequently supply sulfur to the crucible in the vacuum deposition vessel, the operation of the apparatus requires considerable time, because the pressure in the vacuum deposition vessel must be raised to atmospheric pressure each time sulfur is to be supplied and then lowered to the vacuum conditions after the sulfur content in the crucible has been increased. In addition, since sulfur is evaporated at a relatively low temperature of 300° C. or less and has a higher vapor pressure than those of most other deposition materials, the amount of the sulfur being evaporated can be changed by the effect of the heat generated from the high temperature deposition sources of the other deposition materials, thereby deteriorating the reproducibility of the film formation.

SUMMARY OF THE INVENTION

In consideration of the above problems of the prior art, an object of the present invention is to provide a method and an apparatus for producing a thin film which are capable of forming a thin film by simultaneously depositing a plurality of deposition materials which have been evaporated under different conditions. Another object of the invention is to form a thin sulfide film by simultaneously depositing elemental sulfur, preferably in atomic form, and at least one non-sulfurous deposition material wherein the elemental sulfur and the non-sulfurous deposition material have been evaporated under different conditions, using the fact that elemental sulfur has a higher vapor pressure. A further object of the invention is to provide a thin film having a thickness with good reproducibility and improved luminance-voltage characteristics, which is useful as photosensor, a solar cell, a thin film transistor, or a light emitting element of a thin film light emitting element.

A thin sulfide film producing method in accordance with the present invention comprises generating elemental sulfur vapors in an external vessel separately provided outside the vacuum deposition vessel, introducing the thus generated elemental sulfur vapors through a vapor inlet tube to a region near the substrate, which is positioned on a substrate holder in the vacuum deposition vessel, in order to provide a sulfureous atmosphere in the vicinity of the substrate, and producing on the substrate a chemical bonding of the elemental sulfur vapors and the vapors of other deposition materials which have been generated from deposition sources within the vacuum deposition vessel, to form a thin sulfide film.

In a preferred embodiment of the invention, vapors of elemental sulfur are introduced through a vapor inlet tube which projects inwardly into the vacuum deposition vessel and extends to a region adjacent to the substrate to thereby generate an atmosphere of sulfur vapors at least substantially localized around the surface of the substrate to be coated, thereby improving the controllability of the sulfur and the efficiency of use of the sulfur. In addition, in a presently preferred embodiment of the invention, the vapor inlet tube that projects inwardly of the vacuum deposition vessel in order to generate the atmosphere of elemental sulfur vapors around the substrate is heated so as to prevent the solidification of sulfur on the vapor inlet tube and to maintain the sulfur in an active form. While elemental sulfur is free of any other elements, it can have several forms, with the most common solid elemental sulfur being a rhombic crystalline solid. The vapors of elemental sulfur can also have several forms, including atomic sulfur and combinations of sulfur atoms either in ring form or non-ring form. A common sulfur ring is the eight-member ring. The sulfur rings are not as desirable for the formation of the thin sulfide film as are single sulfur atoms. However, the heating of the vapor inlet tube at 350° C. or more also causes the dissociation of any sulfur eight-member rings to produce single sulfur atoms having high reactivity, thereby increasing the efficiency of use of the sulfur.

In one embodiment of the invention, an electron beam deposition apparatus can be used as a deposition source of a first deposition material within the vacuum deposition vessel, while vapors of a second deposition material are provided through the vapor inlet tube from the external vessel. In an electron beam deposition method, an electron beam is not generated if the pressure at the electron gun is too high. However, in the present invention, the pressure of the region near an electron gun is not increased to such level, since the atmosphere of the vapors of the second deposition material is substantially localized around the substrate to be coated. Thus, an electron beam can be generated in this embodiment without any difficulties.

In another embodiment of the invention, a film-forming vacuum deposition chamber contains the substrate to be coated and at least one source of deposition material, while vapors of a second deposition material, e.g., elemental sulfur, are generated in an external vessel positioned outside the vacuum deposition vessel and are introduced through the vapor inlet tube to a region within the vacuum deposition vessel near the substrate. Thus, no problem is caused by any decomposition products which are produced when a film is formed by introducing a gaseous sulfur compound or the like. In the formation of a thin sulfide film, the controllability of the sulfur in the thin film is improved, and the probability of the adhesion of the sulfur to the substrate and the efficiency of use of the sulfur can be increased, as compared with the case in which an atmosphere of sulfur is simply generated from a source of sulfur positioned within the vacuum deposition vessel.

DESCRIPTION OF THE PREFERRED EMBODIMENTS

Figure 2:
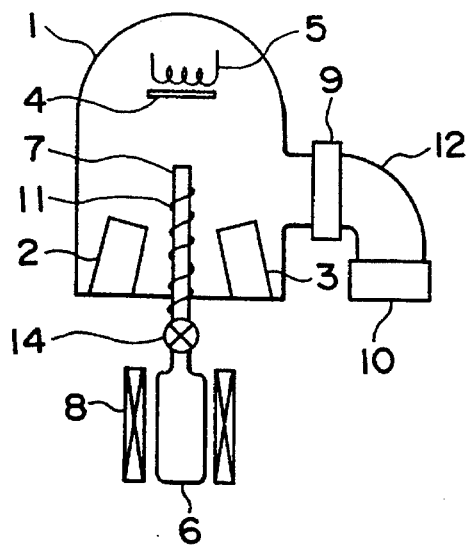
FIG. 2 is a schematic drawing showing a first structure of a MSD vacuum film-forming apparatus in accordance with the first embodiment of the invention.

A first embodiment of the present invention is described below with reference to the formation of a thin sulfide film in a MSD apparatus having the structure of FIG. 2, FIG. 3, or FIG. 4. In FIG. 2, a vacuum deposition vessel 1 contains a plurality of deposition sources 2 and 3, a substrate holder 4, and a substrate heater 5. Each of the plurality of deposition sources 2 and 3 comprises a crucible for holding a first deposition material. The deposition material in the deposition source 2 can be the same as or different from the deposition material in the deposition source 3. An exhaust pipe 12, which can be provided on the side of the vacuum deposition vessel 1, provides fluid communication from the interior of the vacuum deposition vessel 1 to a vacuum pump 10 through an exhaust valve 9. An external vessel 6 is positioned outside of the vacuum deposition vessel 1, and has a heater 8 provided in heat exchanging relation with the outer periphery of the external vessel 6, in order to vaporize elemental sulfur contained within the external vessel. The heater 8 can be in the form of an annular element, with or without a bottom heating element, to provide heat transfer to at least substantially all of the external vessel 6. A vapor inlet tube 7 provides for the flow of vaporous elemental sulfur from the external vessel 6 to a region of the vacuum deposition vessel 1 which is adjacent to the exposed surface of a substrate on the substrate holder 4. The external vessel 6 is preferably disposed at a position beneath the lower surface of the vacuum deposition vessel 1, with the vapor inlet tube 7 being connected to the upper surface of the external vessel 6 and extending at least substantially vertically through the bottom wall of the vacuum deposition vessel 1 to a region of the vacuum deposition vessel 1 near the substrate holder 4, so that the vaporous elemental sulfur will flow upwardly through the linear inlet tube 7 into the vacuum deposition vessel 1 without any significant condensation thereof. The vapor inlet tube 7 contains an inlet valve 14 to control the rate of flow of elemental sulfur vapors from the external vessel 6 into the vacuum deposition vessel 1. A heater 11 is provided in heat exchanging relation with the outer periphery of the vapor inlet tube 7 to prevent condensation of the sulfur vapors, and preferably to maintain the sulfur vapors in the atomic state during the passage through the vapor inlet tube 7. A resistance heating heater such as a sheath heater, a tantalum heater, or the like, or a heating lamp can be appropriately selected as the heater 11, in order to heat at least a substantial portion of the length of the inlet tube 7 between the inlet valve 14 and the outlet of the tube 7 adjacent to the substrate holder 4.

Figure 3:
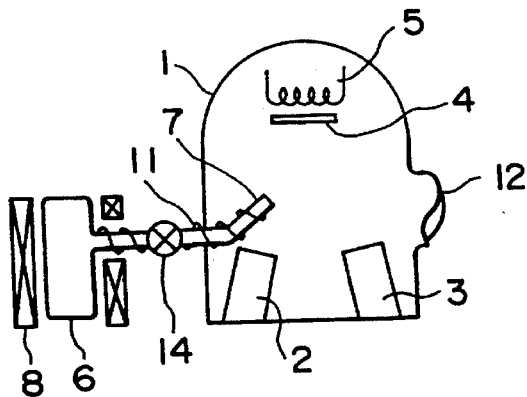
FIGS. 3 and 4 are schematic drawings respectively showing other MSD vacuum film-forming apparatuses also in accordance with the first embodiment of the invention.
Figure 4:
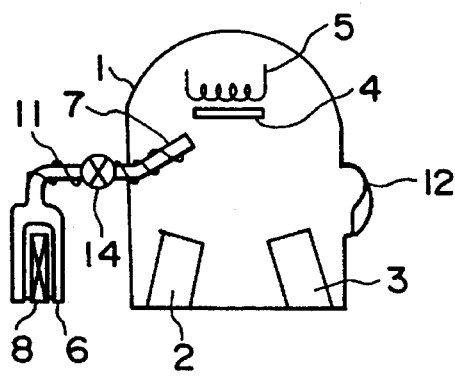

Other MSD vacuum film-forming apparatuses in accordance with the first embodiment of the invention are respectively shown in FIGS. 3 and 4. As elements in FIGS. 3 and 4 which are at least similar to elements in FIG. 2 have the same reference numbers, a detailed description thereof is not repeated. The external vessel 6 can be provided at the side of the vacuum deposition vessel 1, as shown in FIG. 3, or the heater 8 can be provided on an inner surface of the external vessel 6, as shown in FIG. 4. The heater 11 can be appropriately selected in order to heat the full length of the inlet tube 7 including the inlet valve 14, as shown in FIGS. 3 and 4. Any combination of these features can be appropriately selected for utilization in a particular structure of the first embodiment.

Figure 1:
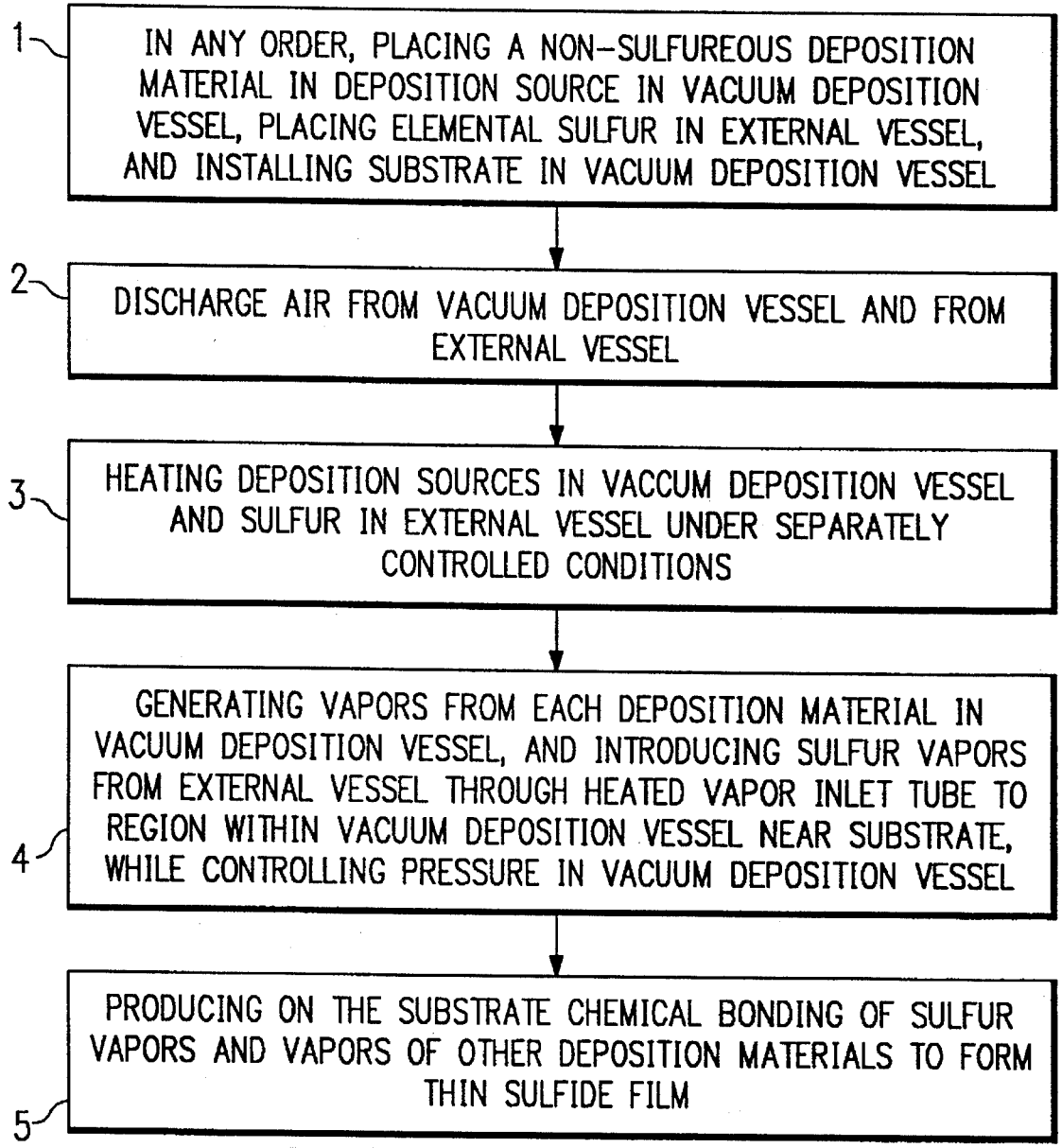
FIG. 1 is a drawing showing a thin sulfide film production process using a MSD vacuum film-forming apparatus in accordance with a first embodiment of the present invention.

FIG. 1 shows a process for producing a thin sulfide film using a MSD vacuum film-forming apparatus in accordance with the first embodiment of the invention. This process comprises the following steps:

(1) in any order, placing a non-sulfureous deposition material in each of the deposition sources 2 and 3 in the vacuum deposition vessel 1, placing a supply of elemental sulfur in the external vessel 6, and fixing on the substrate holder 4 in the vacuum deposition vessel 1 a substrate to be coated;

(2) discharging air from the vacuum deposition vessel 1 and from the external vessel 6, e.g., by using the vacuum pump 10;

(3) heating the deposition sources 2 and 3 in the vacuum deposition vessel 1 and the external vessel 6 separately under controlled conditions;

(4) generating vapors from each of the deposition materials in the deposition sources 2 and 3, and introducing vaporous elemental sulfur, which is in an active state, through the heated vapor inlet tube 7 to a region of the vacuum deposition vessel 1 which is near to the substrate on substrate holder 4, while using inlet valve 14 to control the pressure in the vacuum deposition vessel 1 to form an atmosphere of elemental sulfur vapors in the vicinity of the substrate; and (5) producing on the substrate a chemical bonding of the elemental sulfur vapors in the atmosphere of elemental sulfur vapors and the vapors of the other deposition materials to form a thin sulfide film on the substrate.

Figure 5:
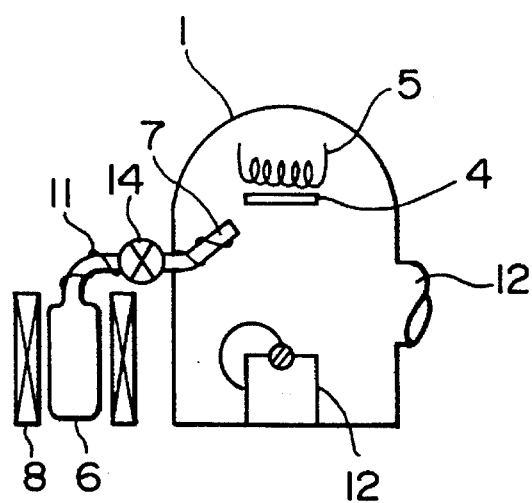
FIG. 5 is a schematic drawing showing an electron beam co-deposition vacuum film-forming apparatus in accordance with a second embodiment of the invention.

FIG. 5 schematically shows the construction of an electron beam deposition vacuum film-forming apparatus in accordance with a second embodiment of the invention. In FIG. 5, the elements which are the same as or similar to those of the first embodiment are denoted by the same reference numerals, and accordingly a detailed description thereof is not repeated.

In FIG. 5, the vacuum deposition vessel 1 contains an electron beam deposition unit 12 as a deposition source. A process for producing a thin sulfide film in accordance with the second embodiment using an electron beam deposition vacuum film-forming apparatus comprises the following steps:

(21) in any order, providing a target comprising non-sulfureous deposition materials in the electron beam deposition unit 12 within the vacuum deposition vessel 1, providing a supply of elemental sulfur in the external vessel 6, and positioning a substrate on the substrate holder 4 in the vacuum deposition vessel 1;

(22) discharging air from the vacuum deposition vessel 1 and from the external vessel 6, e.g., by using the vacuum pump 10;

(23) applying an electron beam to the target in the electron beam deposition unit 12 in the vacuum deposition vessel 1 to generate vapors of a first deposition material from the target, and heating the external vessel 6 to vaporize at least a portion of the elemental sulfur contained therein;

(24) introducing elemental sulfur vapors, preferably in the atomic form, through the heated vapor inlet tube 7 to a region within the vacuum deposition vessel 1 near to the substrate holder 4, while controlling the pressure in the vacuum deposition vessel 1 by the inlet valve 14 to form an atmosphere of sulfur vapors in the immediate vicinity of the substrate on the substrate holder 4; and

(25) producing on the substrate a chemical bonding of the vapors generated from the target and the sulfur vapors in the atmosphere of sulfur vapors, to form a thin sulfide film on the substrate.

The contents and results of an experiment performed with the first embodiment of the invention are described in detail below. In this experiment, a film made of ZnS:Mn and serving as a light emitting layer of a thin film electroluminescence element is formed. A glass substrate is first mounted on the substrate holder 4 in the vacuum deposition vessel 1. The deposition sources 2 and 3 and the external vessel 6 are at least partially filled with Zn, Mn and sulfur, respectively, in their elemental forms. The vacuum pump 10 is driven so as to discharge air from the vacuum deposition vessel 1 and from the external vessel 6 to the atmosphere until the pressure in the vacuum deposition vessel 1 is decreased to $5 \times 10^{-6}$ Torr.

The deposition sources 2 and 3 and the external vessel 6 are separately heated under controlled conditions, so that vapors of Zn and Mn are generated within the vacuum deposition vessel 1, and sulfur vapors are generated within the external vessel 6. The sulfur vapors are introduced through the vapor inlet tube 7, which is provided with the heater 11, to a region within the vacuum deposition vessel 1 near to the substrate holder 4. At this time, the pressure in the vacuum deposition vessel 1 is adjusted to $3 \times 10^{-4}$ Torr by manipulation of the inlet valve 14. The vapors of Zn and Mn are subjected to chemical bonding on the glass substrate in the atmosphere of sulfur vapors to form a thin sulfide film composed of ZnS:Mn. The sulfur vapor atmosphere represents an atmosphere at a pressure which causes the particles such as atoms, molecules, clusters and the like, of the materials which are evaporated from the crucibles of the deposition sources 2 and 3 and from the external vessel 6, to be scattered at least once by sulfur particles before they reach the substrate.

Figure 6:
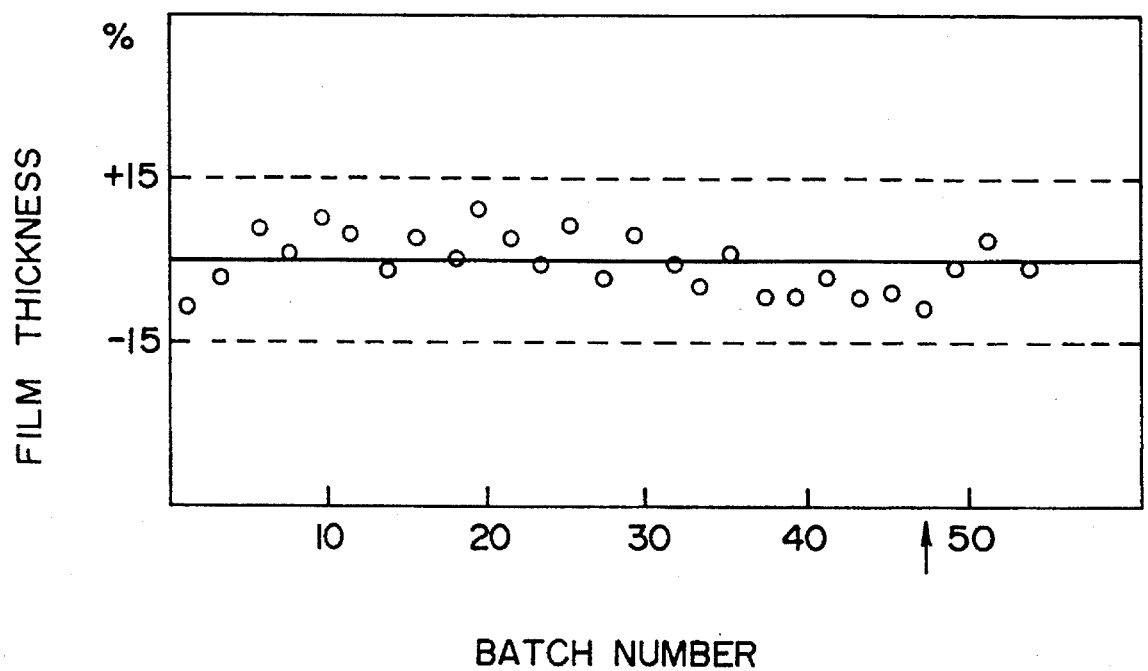
FIG. 6 is a graph showing the reproducibility of the thickness of the film formed in the first embodiment.
Figure 7:
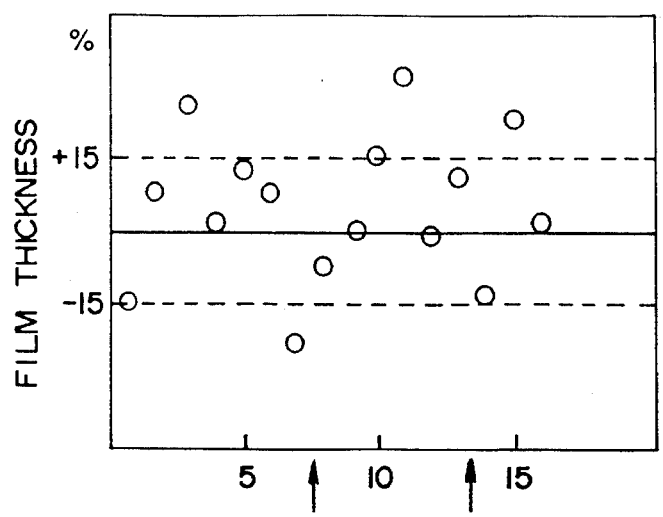
FIG. 7 is a graph showing the reproducibility of the thickness of the film formed by a conventional method.

It is obvious from the experiment that even if a material having a high vapor pressure, such as sulfur, is used, the film formed by the apparatus of this invention in which elemental sulfur is supplied from the outside of the vacuum deposition vessel has a film thickness with good reproducibility, as compared with the film formed by a conventional apparatus in which sulfur is supplied only from a source within the vacuum deposition vessel. The variations in thickness versus batch number shown in FIG. 6, in which the film is formed in the experiment using an apparatus according to the present invention, are smaller than the variations shown in FIG. 7 in which the film is formed by a conventional method. In FIG. 6, each of the film thicknesses is within ±12% of the desired thickness, while in FIG. 7, several of the films have a thickness which is more than 15% off of the desired thickness. The location of an arrow along the batch number axis in FIGS. 6 and 7 indicates the point between batches at which the sulfur supply was replenished. In the experiment, the number of times of resupplying the sulfur to external vessel 6 is decreased to a value of about ⅛ of the number of number of times of resupplying the sulfur in the vacuum deposition vessel in the conventional method.

Figure 8:
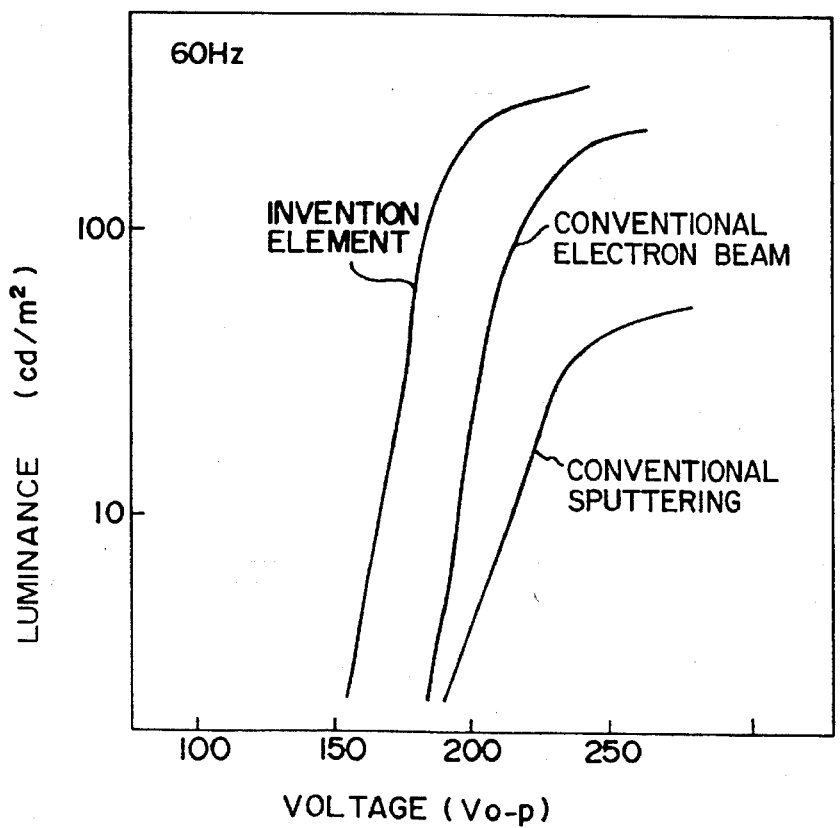
FIG. 8 is a graph comparing the characteristics of the luminance voltages of thin films formed by a method in accordance with the first embodiment of the invention and the luminance voltages of thin films formed by a conventional method.

A thin film electroluminescence element, comprising as a light emitting layer the film made of ZnS:Mn and formed by the apparatus in this experiment, exhibits improved luminance-voltage characteristics, as compared with the thin film electroluminescence element comprising a thin film formed by the conventional electron beam deposition method or the sputtering method, as shown in FIG. 8.

The method and the apparatus of the present invention for producing a thin sulfide film are capable of efficiently forming a film to obtain a thin film of good quality even while the sulfur and the usual deposition materials having different vapor pressures from that of the sulfur are simultaneously deposited. Namely, unlike the simple generation of a sulfur atmosphere directly within the vacuum deposition vessel, the generation of a sulfur vapor atmosphere substantially only around the substrate improves the controllability of the sulfur in the film and the efficiency of use of the sulfur. The method and apparatus of the invention are thus capable of forming a thin film of high quality with good reproducibility, as compared with the thin film formed by a conventional method. The number of resupplies of sulfur can also be decreased.

The method and apparatus of the present invention can also be applied to the formation of a thin sulfide film useful as a light emitting layer of a thin film light emitting element as well as the formation of a thin film of CdS, CdS/InP, PbS or the like useful as a photosensor, a solar cell or a thin film transistor (TFT).

Sulfur, phosphorus and the like have a low probability of adhesion to a substrate, as compared with other deposition materials such as Cd, In, Pd and the like, and thus must be evaporated in an amount greater than those of other deposition materials, with high effectiveness. Thus, the method and apparatus of the present invention can also be applied to the formation of a thin film which does not contain sulfur, but which incorporates phosphorus or another deposition material having a lower probability of adhesion to the substrate than the remaining deposition materials such as Cd, In, Pd and the like, which are being incorporated into the film, with the vapors of the phosphorus or such other low adhesion deposition material being supplied from the external vessel.

While it is presently preferred for the sole source of sulfur vapors to be the external vessel, a minor portion of the sulfur vapors can be provided from a deposition source positioned within the vacuum deposition vessel. However, it is desirable that the atmosphere of sulfur vapors be most heavily concentrated in the immediate vicinity of the substrate surface on which the thin film is to be formed.

Reasonable variations and modifications are possible within the scope of the foregoing description, the drawings and the appended claims to the invention. For example, the air in the vacuum vessel could be replaced with an inert gas so that the vacuum vessel is free of molecular oxygen gas during the deposition process.

What is claimed is:

1. A method of producing a thin film on a substrate using a vacuum deposition vessel containing a substrate holder and at least one source of first deposition material, said method comprising:

positioning a substrate on said substrate holder;

providing first deposition material in said at least one source of first deposition material;

providing second deposition material in an external vessel which is located outside of said vacuum deposition vessel;

discharging air from the vacuum deposition vessel and from the external vessel;

generating in said vacuum deposition vessel vapors of said first deposition material;

generating in said external vessel vapors of said second deposition material;

introducing said vapors of said second deposition material from said external vessel into said vacuum deposition vessel through a vapor inlet tube which projects inwardly into said vacuum deposition vessel and has an outlet positioned adjacent to said substrate holder in order to form an atmosphere of vapors of said second deposition material within said vacuum deposition vessel concentrated in the vicinity of said substrate; and producing chemical bonding, on said substrate, of the vapors of said first deposition material and the vapors of said second deposition material to form a thin film on said substrate.

2. A method in accordance with claim 1, wherein said second deposition material has a higher vapor pressure than said first deposition material, and further comprising heating said vapor inlet tube along at least substantially its length.

3. A method in accordance with claim 1, wherein said second deposition material is elemental sulfur, and further comprising heating said vapor inlet tube along at least substantially its length.

4. A method in accordance with claim 1, wherein vapors of said first deposition material are generated in said vacuum deposition vessel and vapors of said second deposition material are generated in said external vessel by heating the deposition sources in the vacuum deposition vessel and the external vessel separately under controlled conditions.

5. A method in accordance with claim 1 wherein a plurality of sources of first deposition material are provided within said vacuum deposition vessel, each of said plurality of sources containing a different first deposition material, wherein vapors of each said first deposition material are generated in said vacuum deposition vessel by heating each of said plurality of sources of first deposition material, and further comprising controlling the flow of vapors of said second deposition material through said vapor inlet tube.

6. A method in accordance with claim 1, wherein the vapors of said first deposition material are generated from an electron beam deposition unit positioned within said vacuum deposition vessel, said electron beam deposition unit having a target comprising first deposition material.

7. A method of producing a thin sulfide film on a substrate using a vacuum deposition vessel containing a substrate holder and at least one source of deposition material, said method comprising:

positioning a substrate on said substrate holder;

providing deposition material in said at least one source of deposition material;

providing elemental sulfur in an external vessel which is located outside of said vacuum deposition vessel;

discharging air from the vacuum deposition vessel and from the external vessel;

generating in said vacuum deposition vessel vapors of said deposition material;

generating in said external vessel vapors of elemental sulfur;

introducing the elemental sulfur vapors from said external vessel into said vacuum deposition vessel through a vapor inlet tube in order to form an atmosphere of elemental sulfur vapors within said vacuum deposition vessel in the vicinity of said substrate; and producing chemical bonding, on said substrate, of the vapors of said deposition material and the elemental sulfur vapors to form a thin sulfide film on said substrate.

8. A method in accordance with claim 7, wherein the deposition material in said at least one source of deposition material is non-sulfureous.

9. A method in accordance with claim 7, wherein vapors of said deposition material are generated in said vacuum deposition vessel and said elemental sulfur vapors are generated in said external vessel by heating the deposition sources in the vacuum deposition vessel and the external vessel separately under controlled conditions.

10. A method in accordance with claim 7, further comprising heating said vapor inlet tube sufficiently to prevent condensation of the elemental sulfur vapors passing therethrough and to maintain the elemental sulfur vapors in an active state.

11. A method in accordance with claim 7, wherein a plurality of sources of deposition material are provided within said vacuum deposition vessel, each of said plurality of sources containing a different deposition material, wherein vapors of each said deposition material are generated in said vacuum deposition vessel by heating each of said plurality of sources of deposition material, and further comprising controlling the flow of elemental sulfur vapors through said vapor inlet tube.

12. A method in accordance with claim 7, wherein the vapors of said first deposition material are generated from an electron beam deposition unit positioned within said vacuum deposition vessel, said electron beam deposition unit having a target comprising deposition material.

13. A method in accordance with claim 7, further comprising utilizing said thin sulfide film to form an article of manufacture selected from the group consisting of a photosensor, a solar cell, a thin film transistor, and a thin film light emitting element.

14. A method in accordance with claim 7, wherein the step of producing chemical bonding to form said thin sulfide film comprises forming a material selected from the group consisting of CdS, CdS/InP, PbS, and ZnS:Mn.

15. A method in accordance with claim 7, wherein said method is repeated a plurality of times to produce a plurality of thin sulfide films having good reproducibility of film thickness as compared with film formed by a conventional apparatus in which sulfur is supplied only from a source within the vacuum deposition vessel.

16. A method in accordance with claim 7, wherein said thin sulfide film is made of ZnS:Mn and constitutes a light emitting layer, and wherein said thin sulfide film on said substrate exhibits an improved luminance-voltage characteristic as compared with a thin film electroluminescence element comprising a thin film formed by a method wherein the sulfur is supplied only from a source within the vacuum deposition vessel.

* * * * *